(12) United States Patent
Chen et al.

(10) Patent No.: US 12,278,206 B2
(45) Date of Patent: Apr. 15, 2025

(54) SEMICONDUCTOR PACKAGE WITH CONDUCTIVE ADHESIVE THAT OVERFLOWS FOR RETURN PATH REDUCTION AND ASSOCIATED METHOD

(71) Applicant: Airoha Technology (HK) Limited, North Point (HK)

(72) Inventors: Chun-Wei Chen, Hsinchu County (TW); Yan-Bin Luo, Taipei (TW); Ming-Yin Ko, Hsinchu County (TW)

(73) Assignee: Airoha Technology (HK) Limited, North Point (HK)

( * ) Notice: Subject to any disclaimer, the term of this patent is extended or adjusted under 35 U.S.C. 154(b) by 563 days.

(21) Appl. No.: 17/832,721

(22) Filed: Jun. 6, 2022

(65) Prior Publication Data
US 2023/0238349 A1    Jul. 27, 2023

Related U.S. Application Data

(60) Provisional application No. 63/303,914, filed on Jan. 27, 2022.

(51) Int. Cl.
*H01L 23/00* (2006.01)
*H01L 23/498* (2006.01)

(52) U.S. Cl.
CPC ........ *H01L 24/32* (2013.01); *H01L 23/49811* (2013.01); *H01L 23/49833* (2013.01); *H01L 24/29* (2013.01); *H01L 24/48* (2013.01); *H01L 24/73* (2013.01); *H01L 2224/2919* (2013.01); *H01L 2224/32057* (2013.01); *H01L 2224/32225* (2013.01); *H01L 2224/48225* (2013.01); *H01L 2224/73265* (2013.01); *H01L 2924/0781* (2013.01); *H01L 2924/1204* (2013.01)

(58) Field of Classification Search
CPC ................................. H01L 24/32; H01L 24/29
See application file for complete search history.

(56) References Cited

U.S. PATENT DOCUMENTS

| | | |
|---|---|---|
| 6,930,381 B1 | 8/2005 | Cornelius |
| 8,796,140 B1 | 8/2014 | Gu |
| 2009/0278244 A1 | 11/2009 | Dunne |
| 2015/0061151 A1 | 3/2015 | Kuo |

(Continued)

FOREIGN PATENT DOCUMENTS

| | | | | |
|---|---|---|---|---|
| CN | 104429173 A | * | 3/2015 | ............ B32B 15/04 |
| CN | 207652761 U | * | 7/2018 | |
| CN | 108368409 A | * | 8/2018 | ............ C08G 18/42 |

(Continued)

*Primary Examiner* — Michele Fan
(74) *Attorney, Agent, or Firm* — Winston Hsu

(57) ABSTRACT

A semiconductor package includes a printed circuit board (PCB), a semiconductor device, an interposer, and a conductive adhesive. The PCB has a top surface with at least one ground area formed thereon. The semiconductor device has a bottom surface with at least one first first-type contact formed thereon. The interposer is located between the semiconductor device and the PCB. The bottom surface of the semiconductor device is adhered to a top surface of the interposer by the conductive adhesive. The conductive adhesive overflows from an edge of the top surface of the interposer to have contact with the at least one ground area on the top surface of the PCB.

8 Claims, 5 Drawing Sheets

(56) References Cited

U.S. PATENT DOCUMENTS

2020/0395342 A1    12/2020    Bonifield

FOREIGN PATENT DOCUMENTS

| | | | | |
|---|---|---|---|---|
| CN | 108966478 B | * | 2/2021 | ........... H05K 1/0224 |
| TW | 200503210 | | 1/2005 | |
| TW | 200820389 | | 5/2008 | |
| TW | 201428900 A | | 7/2014 | |
| TW | 202123407 A | | 6/2021 | |
| WO | WO-2015137132 A1 | * | 9/2015 | ............. C23C 18/20 |

* cited by examiner

SEMICONDUCTOR PACKAGE WITH CONDUCTIVE ADHESIVE THAT OVERFLOWS FOR RETURN PATH REDUCTION AND ASSOCIATED METHOD

CROSS REFERENCE TO RELATED APPLICATIONS

This application claims the benefit of U.S. Provisional Application No. 63/303,914, filed on Jan. 27, 2022. The content of the application is incorporated herein by reference.

BACKGROUND OF THE INVENTION

1. Field of the Invention

The present invention relates to a semiconductor package, and more particularly, to a semiconductor package with a conductive adhesive that overflows for return path reduction and an associated method.

2. Description of the Prior Art

Currents always flow from a source to a load and then back via a return path. For low frequencies, the ground current takes up the path of least resistance. For high frequencies, the ground current takes up the path of least impedance (which consists of a resistive part and a reactive part). When an alternating current passes through a return path, it sets up an electric field in its vicinity, which may degrade the overall system performance. Hence, the return path should be properly handled for better signal integrity.

In a first conventional design, a wire bonding process is used to connect the semiconductor device ground to the printed circuit board (PCB) ground. However, it increases the return path, resulting in performance degradation, and increases the size of the PCB layout area. In a second conventional design, a through silicon via (TSV) method is used to reduce the return path. However, it is a high-cost solution due to the complex process. In a third conventional design, the components that can be used are restricted to those that can be directly connected to the PCB ground, which reduces the selectivity of product applications.

Thus, there is a need for an innovative semiconductor package design that employs a low-cost solution for return path reduction and is applicable to a variety of product applications.

SUMMARY OF THE INVENTION

One of the objectives of the claimed invention is to provide a semiconductor package with a conductive adhesive that overflows for return path reduction and an associated method.

According to a first aspect of the present invention, an exemplary semiconductor package includes a printed circuit board (PCB), a semiconductor device, an interposer, and a conductive adhesive. The PCB has a top surface with at least one ground area formed thereon. The semiconductor device has a bottom surface with at least one first first-type contact formed thereon. The interposer is located between the semiconductor device and the PCB. The bottom surface of the semiconductor device is adhered to a top surface of the interposer by the conductive adhesive. The conductive adhesive overflows from an edge of the top surface of the interposer to have contact with the at least one ground area on the top surface of the PCB.

According to a second aspect of the present invention, a method for fabricating a semiconductor package is disclosed. The method includes: placing an interposer above a printed circuit board (PCB), wherein the PCB has a top surface with at least one ground area formed thereon; applying a conductive adhesive to a top surface of the interposer, comprising: allowing the conductive adhesive to overflow from an edge of the top surface of the interposer to have contact with said at least one ground area on the top surface of the PCB; stacking a semiconductor device on the interposer through the conductive adhesive, wherein the semiconductor device has a bottom surface with at least one first first-type contact formed thereon.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating measurement results obtained under a condition that the system power is on.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
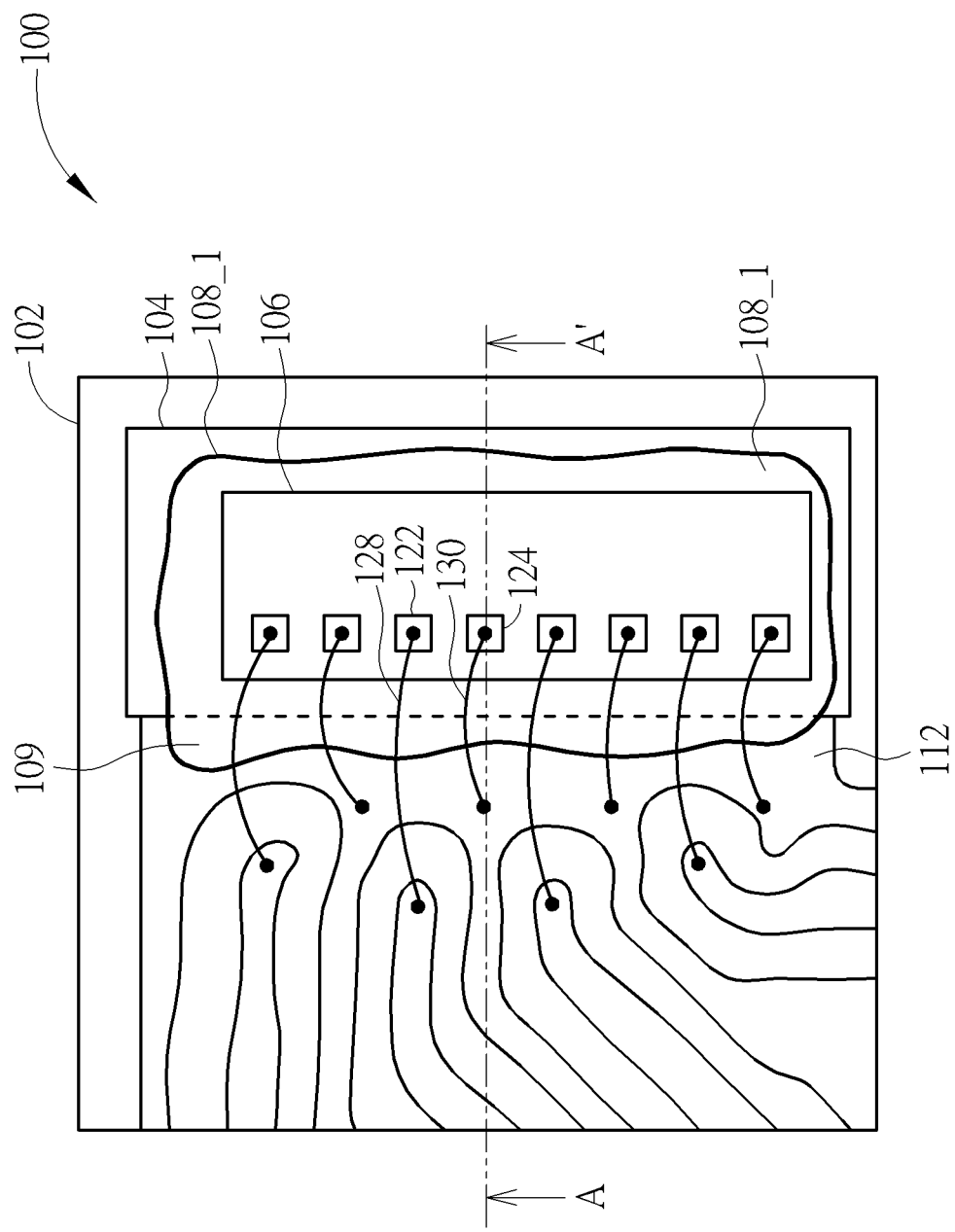
FIG. 1 shows a top view of a semiconductor package according to an embodiment of the present invention.
Figure 2:
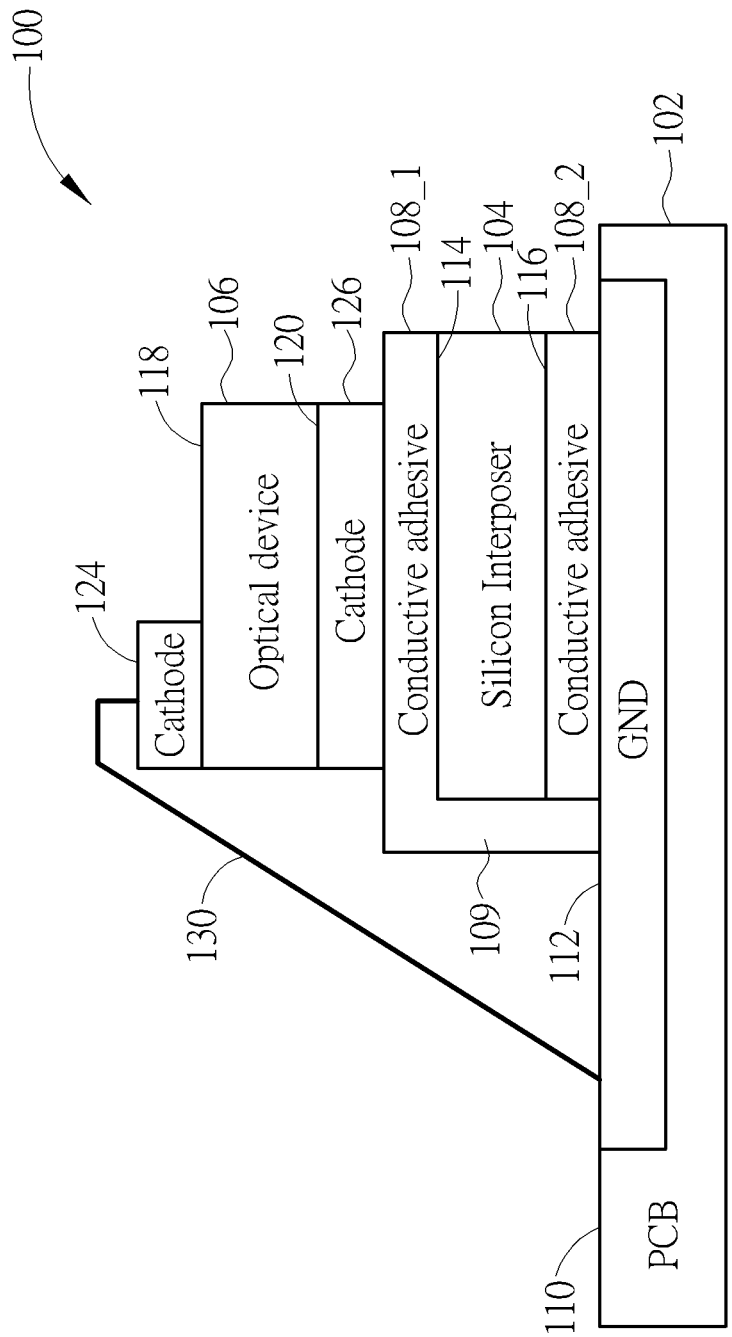
FIG. 2 shows a cross-sectional view along the line A-A' of the semiconductor package shown in FIG. 1.

Please refer to FIG. 1 in conjunction with FIG. 2. FIG. 1 shows a top view of a semiconductor package according to an embodiment of the present invention. FIG. 2 shows a cross-sectional view along the line A-A' of the semiconductor package shown in FIG. 1. The semiconductor package 100 may include a printed circuit board (PCB) 102, an interposer (e.g., a silicon interposer 104), a semiconductor device (e.g., an optical device 106), and conductive adhesives (which are glues that include electrically conductive components) 108 1and 108_2. The PCB 102 has a top surface 110 with at least one ground area (labeled by "GND" in FIG. 2) 112 formed thereon. For example, the ground area 112 may act as a ground plane. The silicon interposer 104 is placed above the PCB 102. By way of example, but not limitation, the silicon interposer 104 is used to help the optical alignment between photonic integrated circuits (which may be collectively referred to as the optical device 106) mounted on the silicon interposer 104. In this embodiment, the silicon interposer 104 may be stacked on the PCB 102 through the conductive adhesive 108_2. Specifically, a bottom surface 116 of the silicon interposer 104 is adhered to the top surface 110 of the PCB 102 by the conductive adhesive 108_2.

The optical device 106 may have one or more first-type contacts and one or more second-type contacts. For example, the first-type contact may be referred to as an n-contact or a cathode, and the second-type contact may be referred to as a p-contact or an anode. In other words, the terms "first-type contact", "n-contact" and "cathode" may be interchangeable, and the terms "second-type contact", "p-contact" and "anode" may be interchangeable. The optical device 106 has a bottom surface 120 with at least one first-type contact (labeled by "Cathode" in FIG. 2) 126 formed thereon. In this embodiment, the optical device 106 is stacked on the silicon interposer 104 through the conductive adhesive 108_1. Specifically, the bottom surface 120 of the optical device 106 is adhered to a top surface 114 of the silicon interposer 104 by the conductive adhesive 108_1, such that the first-type contact 126 has contact with the conductive adhesive 108_1. Furthermore, the conductive adhesive 108_1 overflows from an edge of the top surface 114 of the silicon interposer 104 to have contact with the ground area 112 on the top surface 110 of the PCB 102, such that the first-type contact 126 is electrically connected to the ground area 112 through the conductive adhesive 108_1. Specifically, during a process of applying the conductive adhesive 108_1 to the top surface 114 of the silicon interposer, the conductive adhesive 108_1 is allowed to spread over the edge of the silicon interposer 104. In this way, the conductive adhesive 108_1 is extended to an overflow area 109 that is outside the silicon interposer 104 and has contact with the ground area 112 on the PCB 102. Hence, a shorter return path can be established between the first-type contact 126 of the optical device 118 and the ground area (e.g., ground plane) 112 of the PCB 102 through the conductive adhesive 108_1, without the need of through silicon vias (TSVs) fabricated in the silicon interposer 104.

In some embodiments of the present invention, the optical device 118 has a top surface 118 with at least one second-type contact 122 and at least one first-type contact (labeled by "Cathode" in FIG. 2) 124 formed thereon. As shown in FIG. 1, the optical device 118 may have four second-type contacts 122 and four first-type contacts 124, where each second-type contact 122 is electrically connected to a signal trace formed on the top surface 110 of the PCB 102 through a bonding wire 128, and each first-type contact 124 is electrically connected to the ground area 112 on the top surface 110 of the PCB 102 through a bonding wire 130. It should be noted that, since the semiconductor device ground (e.g., optical device cathode) can be electrically connected to the PCB ground through the return path provided by the conductive adhesive 108_1, the bonding wires 130 may be omitted, depending upon actual design consideration.

Compared to the conventional design using wire bonding to connect the semiconductor device ground (e.g., optical device cathode) to the PCB ground, the proposed solution enables a shorter return path between the semiconductor device ground (e.g., optical device cathode such as first-type contact 126 of optical device 106) and the PCB ground (e.g., ground area 112 of PCB 102), thereby achieving better system performance due to lower cross talk level between adjacent signals. That is, by using the proposed solution to reduce the return path for getting the lower crosstalk level between adjacent signals, the better performance of the system can be obtained. No matter whether the system power is on or not, the crosstalk level of the semiconductor package 100 with the conductive adhesive 108_1 that overflows for return path reduction is always lower than that of the conventional design.

Figure 3:
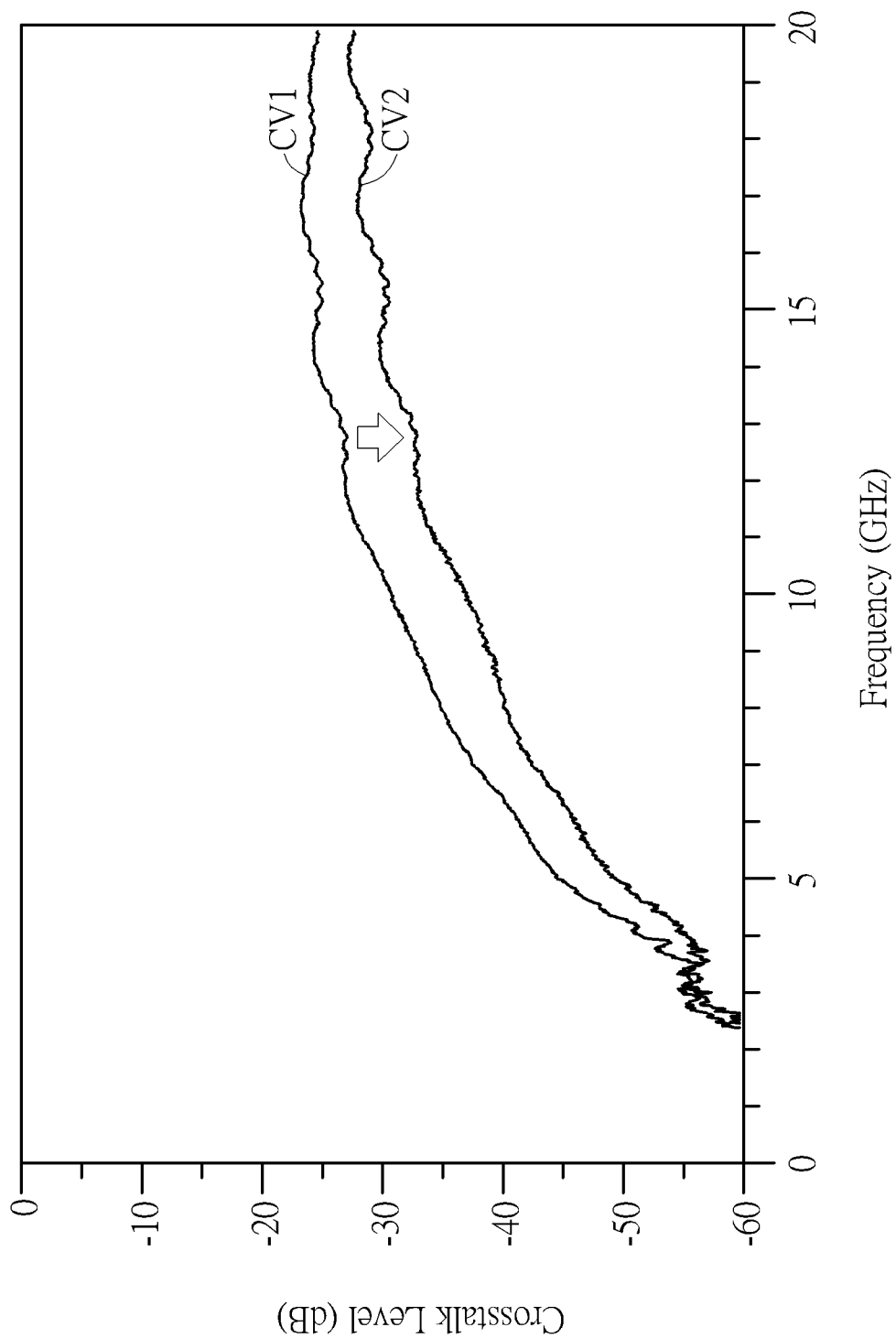
FIG. 3 is a diagram illustrating measurement results obtained under a condition that the system power is off.

FIG. 3 is a diagram illustrating measurement results obtained under a condition that the system power is off. The measurement result of the crosstalk level of the conventional design is represented by the characteristic curve CV1. The measurement result of the crosstalk level of the semiconductor package 100 is represented by the characteristic curve CV2. The semiconductor package 100 has lower crosstalk measured under the power-off state.

Figure 4:
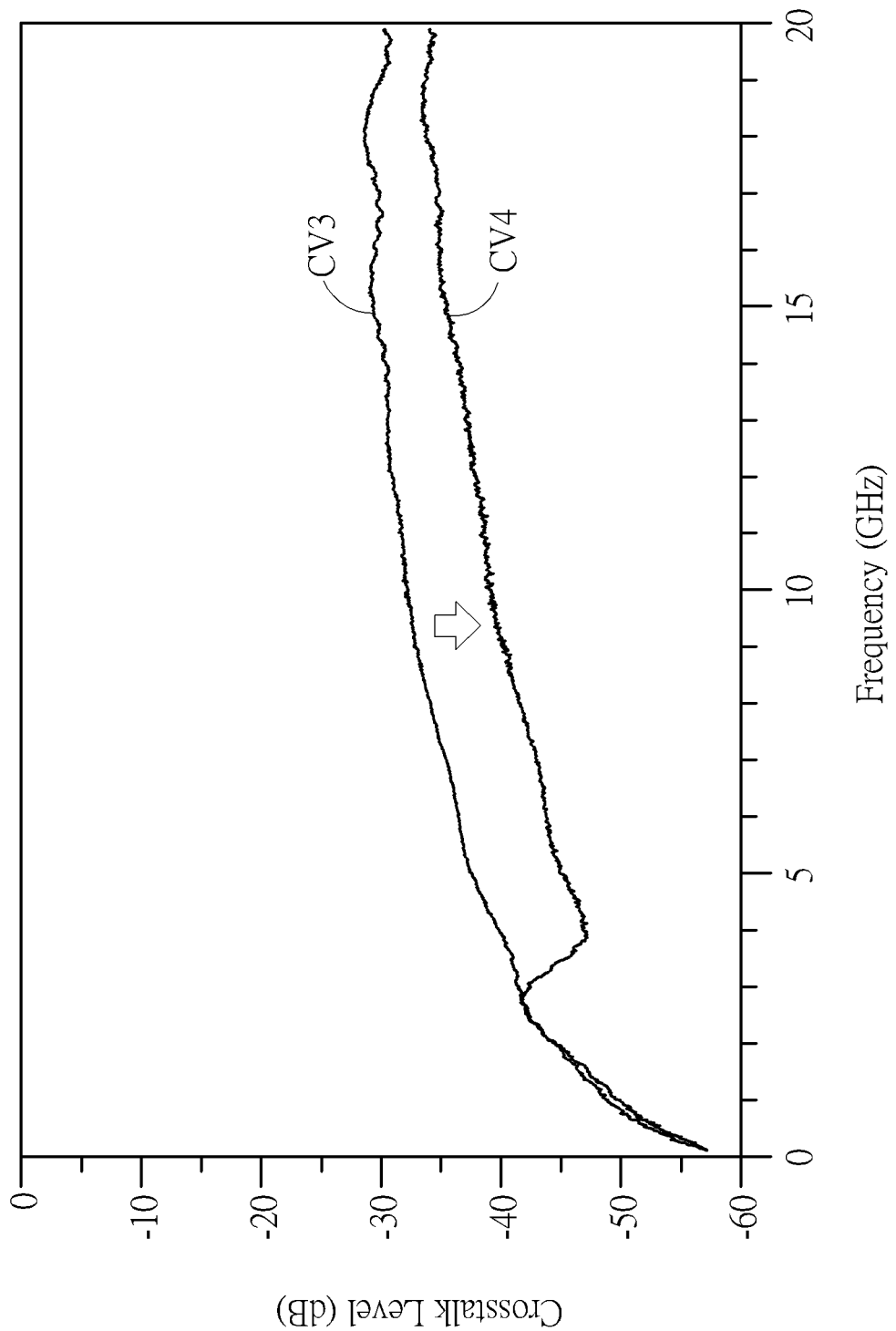

FIG. 4 is a diagram illustrating measurement results obtained under a condition that the system power is on. The measurement result of the crosstalk level of the conventional design is represented by the characteristic curve CV3. The measurement result of the crosstalk level of the semiconductor package 100 is represented by the characteristic curve CV4. The semiconductor package 100 has lower crosstalk measured under the power-on state.

Furthermore, compared to another conventional design using a TSV method for return path reduction, the proposed solution employs a conductive adhesive overflow method for return path reduction, which allows the silicon interposer 104 between the optical device 106 and the PCB 102 to be implemented by a silicon interposer with no TSVs. Hence, the proposed solution is a low-cost solution without the need of a complex TSV process.

Figure 5:
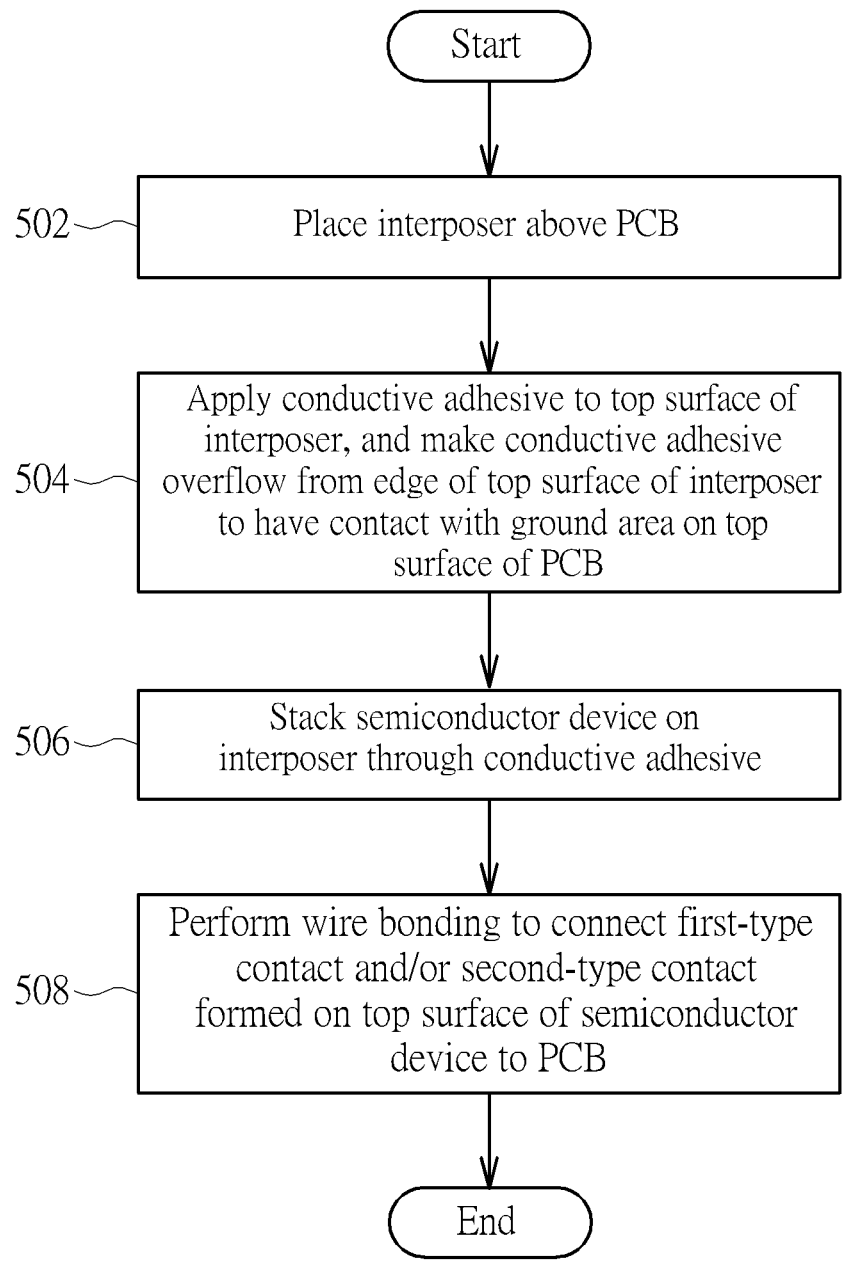
FIG. 5 is a flowchart illustrating a method for fabricating a semiconductor package according to an embodiment of the present invention.

FIG. 5 is a flowchart illustrating a method for fabricating a semiconductor package according to an embodiment of the present invention. Provided that the result is substantially the same, the steps are not required to be executed in the exact order shown in FIG. 5. At step 502, an interposer (e.g., silicon interposer) is placed above a PCB, wherein the PCB has a top surface with at least one ground area formed thereon. At step 504, a conductive adhesive is applied to a top surface of the interposer. During a process of applying the conductive adhesive to the top surface of the interposer, the conductive adhesive is not prevented from overflowing from an edge of the top surface of the interposer. In other words, the conductive adhesive is allowed to flow freely toward the top surface of the PCB. Hence, the conductive adhesive can overflow from the edge of the top surface of the interposer to have contact with at least one ground area on the top surface of the PCB. At step 506, a semiconductor device (e.g., an optical device) is stacked on the interposer through the conductive adhesive, wherein the semiconductor device has a bottom surface with at least one first-type contact formed thereon. At step 508, a wire bonding process is performed to connect at least one second-type contact and/or at least one first-type contact formed on a top surface of the semiconductor device (e.g., optical device) to the PCB. Since a person skilled in the art can readily understand details of the proposed conductive adhesive overflow method after reading above paragraphs, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package comprising:
 a printed circuit board (PCB), having a top surface with at least one ground area formed thereon;
 a semiconductor device, having a bottom surface with at least one first first-type contact formed thereon;
 an interposer, located between the semiconductor device and the PCB;
 a conductive adhesive, wherein the bottom surface of the semiconductor device is adhered to a top surface of the interposer by the conductive adhesive, and the conductive adhesive overflows from an edge of the top surface of the interposer to have contact with said at least one ground area on the top surface of the PCB.

2. The semiconductor package of claim 1, wherein the semiconductor device is an optical device.

3. The semiconductor package of claim 1, wherein the semiconductor device has a top surface with at least one second first-type contact formed thereon, and the semiconductor package further comprises:
 at least one bonding wire, arranged to connect said at least one second first-type contact of the semiconductor device to said at least one ground area of the PCB.

4. The semiconductor package of claim 1, wherein the interposer is a silicon interposer with no through silicon vias (TSVs).

5. A method for fabricating a semiconductor package comprising:
 placing an interposer above a printed circuit board (PCB), wherein the PCB has a top surface with at least one ground area formed thereon;
 applying a conductive adhesive to a top surface of the interposer, comprising:
  allowing the conductive adhesive to overflow from an edge of the top surface of the interposer to have contact with said at least one ground area on the top surface of the PCB;
 stacking a semiconductor device on the interposer through the conductive adhesive, wherein the semiconductor device has a bottom surface with at least one first first-type contact formed thereon.

6. The method of claim 5, wherein the semiconductor device is an optical device.

7. The method of claim 5, wherein the semiconductor device has a top surface with at least one second first-type contact formed thereon, and the method further comprises:
 performing a wire bonding process to connect said at least one second first-type contact of the semiconductor device to said at least one ground area of the PCB.

8. The method of claim 5, wherein the interposer is a silicon interposer with no through silicon vias (TSVs).

* * * * *